(12) United States Patent
Ishikawa

(10) Patent No.: US 7,822,094 B2
(45) Date of Patent: Oct. 26, 2010

(54) SEMICONDUCTOR LASER ELEMENT AND METHOD FOR PRODUCING SAME

(75) Inventor: Shin Ishikawa, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 101 days.

(21) Appl. No.: 12/073,825

(22) Filed: Mar. 11, 2008

(65) Prior Publication Data

US 2009/0003404 A1    Jan. 1, 2009

(30) Foreign Application Priority Data

Mar. 13, 2007   (JP) .............................. 2007-063718

(51) Int. Cl.
*H01S 3/08* (2006.01)
(52) U.S. Cl. ..................... 372/99; 372/49.01; 438/29
(58) Field of Classification Search .............. 372/43.01, 372/45.01, 49.01, 98, 99
See application file for complete search history.

(56) References Cited

U.S. PATENT DOCUMENTS 4,317,086 A * 2/1982 Scifres et al. ............ 372/49.01
4,975,922 A * 12/1990 Sakane et al. ............ 372/49.01
6,285,700 B1   9/2001 Ueno et al.

FOREIGN PATENT DOCUMENTS

JP          11-238940          8/1999

OTHER PUBLICATIONS

Michael Ettenberg, "A new dielectric facet reflector for semiconductor lasers", Applied Physics Letters, vol. 32, No. 11, pp. 725-726, 1978.
Yutaka Nagal, et al., "Study on Droop Characteristics of Laser Diodes as Light Sources of Laser Beam Printer", Japanese Journal of Applied Physics, vol. 34, pp. 6385-6390 Part 1, No. 12 A, (1995).
Kouji Nakahara, et al., Transmission Properties of 1.3-μm InGaAlAs MQW FP Lasers in 10-Gb/s Uncooled Operation, Journal of Lightwave Technology, vol. 23, No. 12, pp. 3997-4003, (2005).

* cited by examiner

*Primary Examiner*—Armando Rodriguez
*Assistant Examiner*—Xnning Niu
(74) *Attorney, Agent, or Firm*—McGinn IP Law Group PLLC

(57) ABSTRACT

A semiconductor laser element realizes a high COD light output in broader range of reflection factor at a facet with high reliability. A semiconductor laser element has a multi-layered reflection film formed on at least one end facet of a resonator. An optical path length of each layer of said multi-layered reflection film is determined by $(2m-1) \cdot \lambda/4$, where $\lambda$ is oscillation wavelength, and m is positive integer). A high-refractive-index layer and a low-refractive-index layer are alternately stacked starting from a first layer adjacent to said semiconductor.

18 Claims, 12 Drawing Sheets

OPTICAL PATH LENGTH OF EACH LAYER: $\lambda/4 - r \cdot n_1 \cdot d_1$
$n_1$: REFRACTIVE INDEX OF THE FIRST LAYER
$d_1$: THICKNESS OF THE FIRST LAYER

SEMICONDUCTOR LASER ELEMENT AND METHOD FOR PRODUCING SAME

REFERENCE TO RELATED APPLICATION

This application is based upon and claims the benefit of the priority of Japanese patent application No. 2007-063718, filed on Mar. 13, 2007, the disclosure of which is incorporated herein in its entirety by reference thereto.

This invention relates to a highly reliable semiconductor laser element that has less facet damage and high resistance against electrostatic breakdown, and a method for producing same.

FIELD OF THE INVENTION

Background of the Invention

A semiconductor laser is broadly utilized for optical communications, optical discs and light sources for measuring instruments due to its small size and high efficient performance. It is necessary for the semiconductor laser to control a reflection factor at an end facet (termed as "facet" hereinafter) of a resonator to obtain a low oscillation threshold and desired slope efficiency. A multiple layered film is generally used for the control of the reflection factor at a facet of a resonator (see FIG. 2 of Non-Patent Document 1, APPLIED PHYSICS LETTERS, vol. 32, No. 11, pp 725-726, 1978). This document discloses a multiple (alternating) layered film made of $Al_2O_3$ layers and amorphous Si layers having an optical path length of $\lambda/4$ ($\lambda$: oscillation wavelength) formed at the facet of the resonator to obtain a desired reflection factor. The first layer adjacent to a semiconductor of the resonator is made of $Al_2O_3$ that has relatively a low index of refraction to make a difference between the refractive indexes of the semiconductor and a coating layer and to obtain a high reflection factor with a smaller number of the layers.

On the other hand, it is known that a characteristic of light power output is limited by catastrophic optical damage (COD). COD is a phenomenon that the facet of the semiconductor melts at a critical light output and is caused by a surface level of the facet. COD frequently becomes a problem when the semiconductor contains aluminum as a component element, which is apt to form a surface oxide layer. COD is a major factor to impair a reliability of the semiconductor laser because it is a nonreversible damaging phenomenon. The light output at which the COD will occur can be improved by reducing a reflection factor of the facet. A critical light intensity that causes COD is an intrinsic value specified by the material, it is possible to improve the light output that causes COD by improving light emission efficiency by reducing the facet reflection factor. The front facet reflection factor is lowered to an order of less than or equal to 10% and the light output that causes COD is improved (elevated) for a particular use that needs a high power output.

However, some uses of semiconductor lasers require a high facet reflection factor and it is not suitable to lower the reflection factor for such a purpose to improve the light output that causes COD. For example, a use that requires a high reflection factor is a light source for a printer as described in FIG. 1 of Non-Patent Document 2 (JAPANESE JOURNAL OF APPLIED PHYSICS, Vol. 34, pp 6385-6390 Part 1, No. 12A, 1995). It is necessary that the light source for a printer should have a small drooping characteristic, that is, a decreasing of the light output after a given time from the start-up by pulse driving. The drooping characteristic can be reduced by limiting a fluctuation of the light output caused by a fluctuation of temperature of an active layer by designing the facet reflection factor high and light emission efficiency low.

Another example of a use that needs a high facet reflection factor is an AlGaInAs/InP semiconductor laser having 1.3-1.6 μm wavelength range as described in FIG. 1 of Non-Patent Document 3 (JOURNAL OF LIGHTWAVE TECHNOLOGY, Vol. 23, No. 12, pp 3997-4003, 2005). The demand for the AlGaInAs/InP semiconductor laser having a wavelength range of 1.3-1.6 μm is increasing as an ultra-high speed light source that requires no temperature control because it possesses a high electronic barrier height of the conductor and superior high temperature characteristics. For a use in optical communications it is necessary to obtain a high relaxation oscillation frequency by decreasing a threshold gain and increasing a differential gain. For this purpose an increasing of a light confinement rate within an active layer and an increasing of reflection factors of both end facets are effective. In a wavelength range of 1.3-1.6 μm, since photon energies are low, the critical light density that causes COD is higher than that of LD of short wavelength range.

A method to improve a "COD light output" (light output that causes COD) independent from the facet reflection factor is disclosed as a semiconductor laser in Patent Document 1 (FIG. 12 of JP-H11-238940A). For the semiconductor laser shown in this document, a refractive index n1 of a coating film is defined by $$n1 = \sqrt{neff \times \frac{1 - R1}{(1 - \sqrt{R1})^2}}$$

where neff is an equivalent refractive index of a waveguide of a semiconductor, and R1 is an emission facet reflection factor.

According to the structure described in Patent Document 1, each of incident electric field to the facet from the semiconductor and electric field reflecting from the coating film has an inversed phase at the facet to cancel each other. As a result, the intensity of the electric field at the facet becomes lower and the COD light output is increased. Application of a coating film having an optimum refractive index in accordance with the facet reflection factor R1 can make it possible to increase COD light output even for broad facet reflection factors.

[Patent Document 1]
  JP Patent Kokai Publication No. JP-A-11-238940

[Non-Patent Document 1]
  APPLIED PHYSICS LETTERS, vol. 32, No. 11, pp 725-726, (1978)

[Non-Patent Document 2]
  JAPANESE JOURNAL OF APPLIED PHYSICS, Vol. 34, pp 6385-6390 Part 1, No. 12A, (1995)

[Non-Patent Document 3]
  JOURNAL OF LIGHTWAVE TECHNOLOGY, Vol. 23, No. 12, pp 3997-4003, (2005)

SUMMARY OF THE DISCLOSURE

The following analyses are given by the present invention. The entire disclosures of the above mentioned Patent Document and Non-Patent Documents are incorporated herein by reference thereto.

A problem of the structure described in Non-Patent Document 1 is a trade-off between characteristics required for the semiconductor laser and the COD light output. When the drooping characteristics of the light source for printers or the high speed operation of the light source for optical communications is improved, the COD light output is decreased, resulting in a problem in the reliability or ESD tolerance. On the contrary, when the COD light output is increased by reducing the facet reflection factor, the required characteristics for each use cannot be achieved. This is the trade-off problem of the semiconductor laser described in Non-Patent Document 1.

The semiconductor laser with an enhanced facet reflection factor described in Non-Patent Document 2 has a trade-off problem between the COD light output and high reflection factors of 50% or more at both front and rear facets.

In the case of Non-Patent Document 3, a surface level density of the surface is high and the COD frequently becomes a problem because it contains Al as a component element. And also the ESD tolerance becomes lower because a COD breakdown current relates to a forward electro-static discharge (ESD) level. That is, trade-off between the high speed operation and both of the COD damaging and the ESD tolerance for that use offers a problem.

In contrast thereto, the structure of the semiconductor laser disclosed in Patent Document 1 breaks a one-to-one correspondence of the reflection factor to the COD light output and therefore the degree of freedom of designing is enlarged. However, there are some problems in the structure described in Patent Document 1.

One problem is that a single layer film is employed for the structure described in Patent Document 1. In this case the maximum reflection factor is defined by the refractive index of the single-layered coating film. Therefore, a coating film having a higher refractive index than the equivalent refractive index of the waveguide of the semiconductor is necessary to obtain a reflection factor of 30% or more. Possible materials are only GaAs, GaP and BP insofar as that Patent Document 1 discloses. These materials sometimes cause a problem of absorption of oscillated light and, in addition, it is difficult to form a film using a commonplace sputtering method or a plasma CVD method. Then the structure cannot be applied easily for a use that needs a high reflection factor larger than or equal to 30%.

A second problem is that an optimum material should be selected corresponding to the desired characteristics of reflection factor. It is rather difficult to select a coating material corresponding to the desired characteristics of reflection factor because various kinds of factors not only refractive index but also such as light transmission characteristics, chemical stability, heat resistance, acid resistance, and easiness of film formation, etc. should be considered in selecting the material. Such limitation of designing a reflection factor and the difficulty of material selection are the problems of the structure disclosed in Patent Document 1.

It is an object of the present invention to provide a highly reliable semiconductor laser element realizing a high COD light output in a broader range of facet reflection factor. It is another object of the present invention to provide a method for producing same. Other objects will become apparent in the entire disclosure of the present application.

In a first aspect of the present invention, there is provided a semiconductor laser element in which multi-layered reflection film is formed on at least one facet of a resonator. A phase difference between emitted laser light and reflected light from the multi-layered reflection film ranges from $(1-0.45)\cdot\pi$ to $(1+0.45)\cdot\pi$ (that is, from $0.55\pi$ to $1.45\pi$) at an emission facet.

In a second aspect of the present invention, there is provided a semiconductor laser element in which an optical path length of each layer of the multi-layered reflection film is determined by $(2m-1)\cdot\lambda/4$ ($\lambda$: oscillation wavelength, m: positive integer). A high refractive index layer and a low refractive index layer are alternately stacked starting from a first layer adjacent to the semiconductor. A numeric value of m for each layer can be the same or can be different. The same shall apply hereafter. Each layer is denoted as a first layer, a second layer and so on from the layer adjacent to the semiconductor and the farthest layer from the semiconductor is denoted as the last layer. The same applies likewise hereinafter.

In a third aspect of the present invention, there is provided a semiconductor laser element in which an optical path length of each layer of the multi-layered reflection film is within ±20% of a value determined by $(2m-1)\cdot\lambda/4$ ($\lambda$: oscillation wavelength, m: positive integer), and a high refractive index layer and a low refractive index layer are alternately stacked starting from the first layer adjacent to the semiconductor.

In a fourth aspect of the present invention, there is provided a semiconductor laser element in which an optical path length of each layer of second and subsequent layers of the multi-layered reflection film is determined by $(2m-1)\cdot\lambda/4$ ($\lambda$: oscillation wavelength, m: positive integer). An optical path length of the first layer adjacent to the semiconductor is determined by $n\cdot\lambda/2$ ($\lambda$: oscillation wavelength, n: positive integer), and a low refractive index layer and a high refractive index layer are alternately stacked starting from the first layer adjacent to the semiconductor. Numeric values of m and n can be the same or can be different. The same applies likewise hereinafter.

In a fifth aspect of the present invention, there is provided a semiconductor laser element in which an optical path length of each layer of second and subsequent layers of the multi-layered reflection film is within ±20% of a value determined by $(2m-1)\cdot\lambda/4$ ($\lambda$: oscillation wavelength, m: positive integer). An optical path length of the first layer adjacent to the semiconductor is within ±20% of a value determined by $n\cdot\lambda/2$ ($\lambda$: oscillation wavelength, n: positive integer). A low refractive index layer and a high refractive index layer are alternately stacked starting from the first layer adjacent to the semiconductor.

In a sixth aspect of the present invention, there is provided a semiconductor laser element in which an optical path length of each layer of second and subsequent layers except a last layer is determined by $\lambda/4-r\cdot n1\cdot d1$ ($\lambda$: oscillation wavelength, r: 0.5-2.5), where n1 and d1 are refractive index and thickness of the first layer adjacent to the semiconductor, respectively. A low refractive index layer and a high refractive index layer are alternately stacked starting from the first layer.

In a seventh aspect of the present invention, there is provided a semiconductor laser element in which the thickness d1 of the first layer adjacent to the semiconductor is 1-60 nm.

In an eighth aspect of the present invention, there is provided a semiconductor laser element in which a guard layer whose optical path length is determined by $m\cdot\lambda/2$ ($\lambda$: oscillation wavelength, m: positive integer) is formed as a last layer of the multi-layered reflection film.

In a ninth aspect of the present invention, there is provided a semiconductor laser element in which a material of the semiconductor is AlGaInAs/InP system having a wavelength range of 1.3 to 1.6 μm.

In a tenth aspect of the present invention, there is provided a method for producing same. The method comprising: providing a resonator; and forming a multi-layered reflection film on at least one facet of the resonator; wherein a phase difference between emitted laser light and reflected light from the multi-layered reflection film is adjusted in a range from $(1-0.45)\cdot\pi$ to $(1+0.45)\cdot\pi$ at an emission facet.

The meritorious effects of the present invention are summarized as follows.

According to the present invention, the intensity of the electric field of a facet portion can be largely reduced and it makes possible to realize a high COD light output. The high COD light output brings reliable operation and improvement of a forward ESD breakdown level. In addition, a reflection factor of 30% or more can be obtained easily by using coating materials having high transmittance and easiness of film formation such as $Al_2O_3$, $SiO_2$, amorphous Si (a-Si), and so on. In summary, a highly reliable semiconductor laser element realizing a high COD light output in a broader range of facet reflection factor and a high ESD tolerance can be obtained by the structure of the present invention.

PREFERRED MODES OF THE INVENTION

Figure 1:
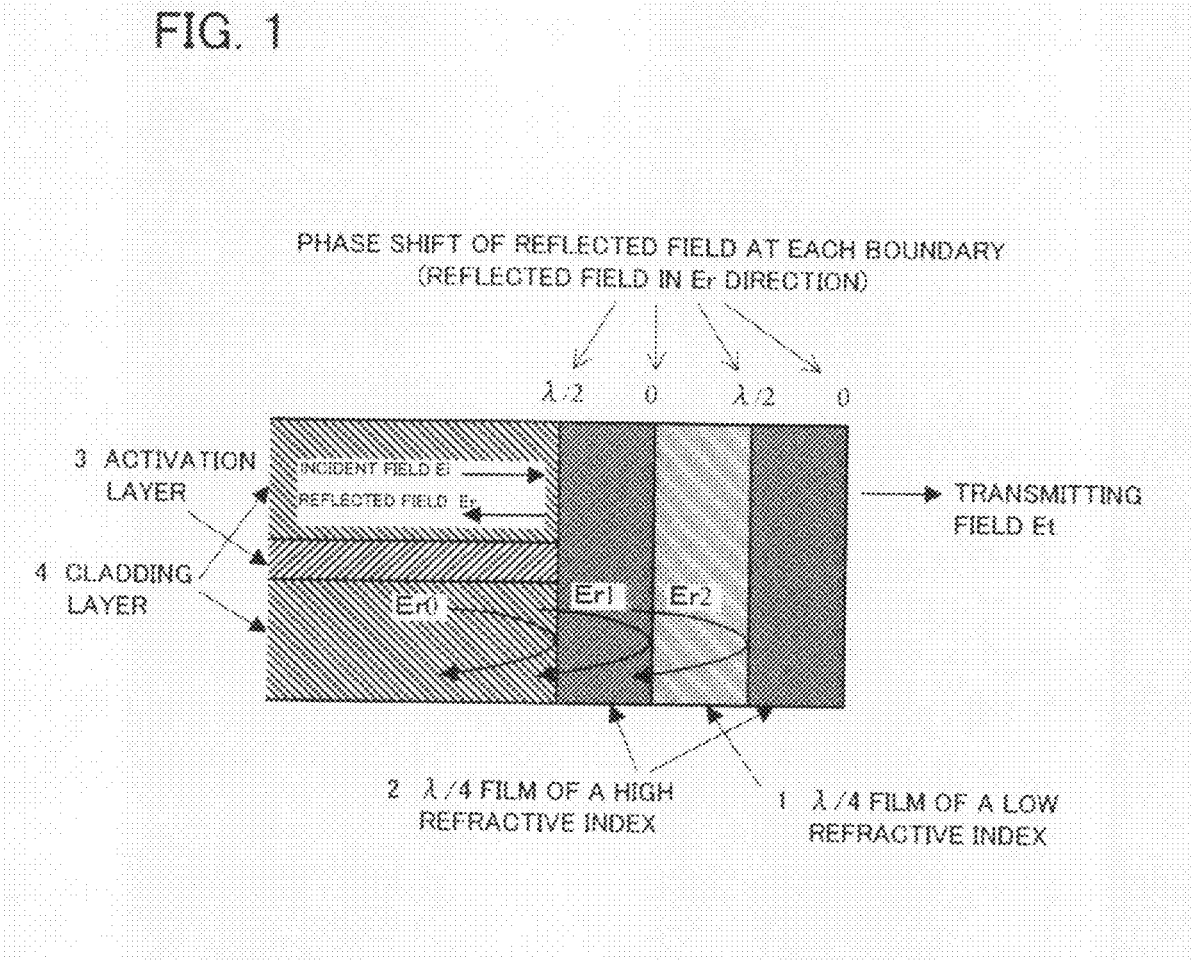
FIG. 1 illustrates an operation principle of a structure of an exemplary semiconductor laser element of the present invention.
Figure 2:
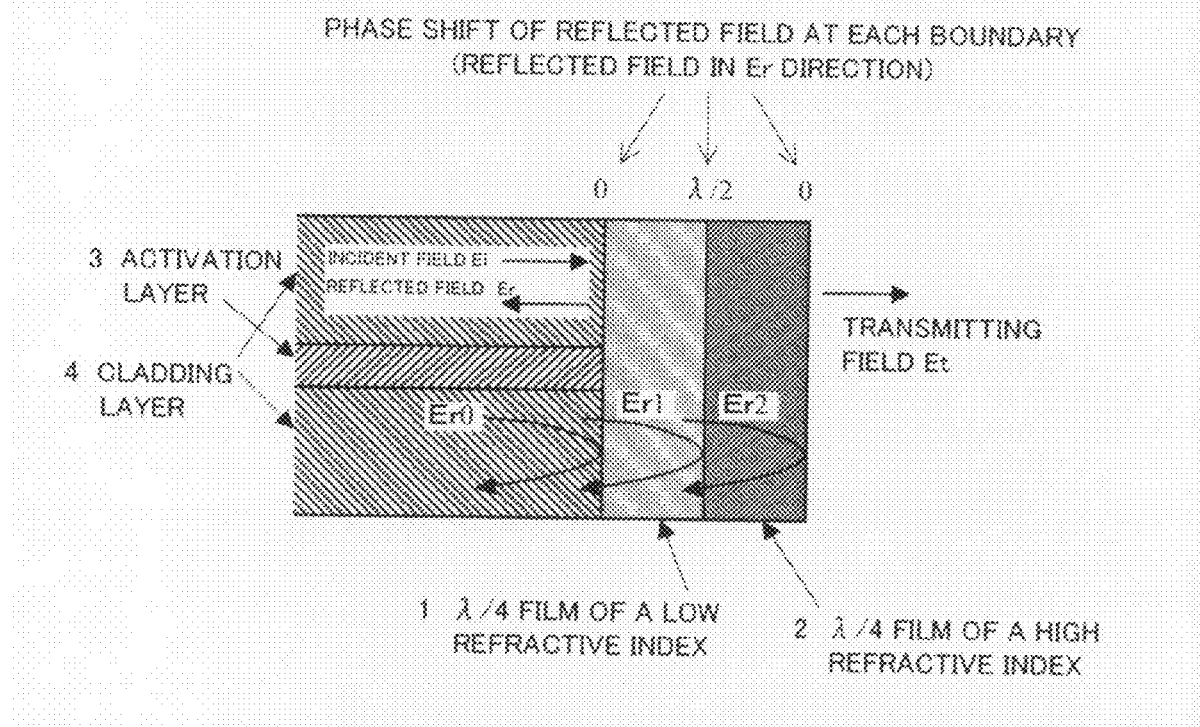
FIG. 2 illustrates an operation principle of a structure of a comparative example of a conventional semiconductor laser element.

A basic principle of the present invention is explained in detail using FIGS. 1 and 2. FIG. 2 illustrates an operation principle of a structure of a comparative example of a conventional semiconductor laser element described in Non-Patent Document 1. A multiple layered film (2 film-layered film is shown in FIG. 2) whose optical path length of the layer is $\lambda/4$ ($\lambda$: oscillation wavelength) each is formed on at least one facet of a semiconductor laser. The film of FIG. 2 is formed by a low refractive index $\lambda/4$ film 1 and a high refractive index $\lambda/4$ film 2 piled successively on the semiconductor to increase a difference of the refractive indexes at the boundaries and obtain high reflection factors by a small number of layers.

When denote an incident electric field from the semiconductor to the multiple layered film, a reflected (electrical) field from the boundaries and a transmitting field by Ei, Er and Et, respectively, the reflected field Er is expressed by a sum of a reflected field Er0 from the first boundary, a reflected field Er1 from a second boundary, a reflected field Er2 from a third boundary, and so on. The phase differences between the incident field Ei and each of the reflected field Er0, Er1 and Er2 are calculated as follows:

A phase difference between Ei and Er0: Phase inversion by reflection at the boundary of the semiconductor and the first layer=0;

A phase difference between Ei and Er1: A phase shift in the first layer+a phase inversion by reflection at the boundary of the first layer and the second layer=$\lambda/4 \times 2 + \lambda/2 = \lambda$;

A phase difference between Ei and Er2: A phase shift in the first and the second layers+a phase inversion by reflection at the boundary of the second layer and the air=$\lambda/4 \times 4 + 0 = \lambda$.

The reflected field Er is the sum of the Er0, Er1, Er2, etc. and therefore a phase difference between the incident field Ei and the reflected Er at the facet becomes even multiples of $\lambda/2$, that is, the Ei and Er have the same phase. The intensity of the electric field in the resonator is represented by $(Ei+Er)^2$ and thus the intensity of the electric field at the facet becomes larger because two electric fields are enhanced by overlapping.

A phase difference between each reflected field Er0, Er1 and Er2 in the conventional structure is calculated as follows.

A phase difference between Er0 and Er1: A phase shift in the first layer+a phase inversion by reflection at the boundary of the first layer and the second layer=$\lambda/4 \times 2 + \lambda/2 = \lambda$;

A phase difference between Er0 and Er2: A phase shift in the first and the second layers+a phase inversion by reflection at the boundary of the second layer and the air=$\lambda/4 \times 4 + 0 = \lambda$.

Because the phase differences between reflected fields Er0, Er1 and Er2 become always even multiples of $\lambda/2$, a high reflection factor can be obtained.

It is necessary to notice that the phase differences of the reflected fields be different at each of the boundaries in the above discussion. When a light wave comes from a layer of a high refractive index to a layer of a low refractive index, the phase of the reflected field does not shift at the boundary. On the other hand, when a light wave comes from a layer of a low refractive index to a layer of a high refractive index, the phase of the reflected field will shift by $\lambda/2$. The phase shifts of the electric fields reflected to the Er direction at the boundaries are also described in FIG. 2.

A basic structure of a semiconductor laser element of the present invention is shown in FIG. 1 compared to a comparative example according to the conventional structure as shown in FIG. 2. The essential difference is that in the present invention, an order of stacked (laminated) layers of high refractive indexes and low refractive indexes is inversed, that is, a $\lambda/4$ film 2 of a high refractive index and a $\lambda/4$ film 1 of a low refractive index are stacked successively in this order on the semiconductor. As shown in FIG. 1, the phase differences of the reflected fields at the boundaries are in a different order compared to the conventional structure. The phase differences between the incident field Ei and each of the reflected field Er0, Er1 and Er2 are calculated as follows according to the present invention:

A phase difference between Ei and Er0: Phase inversion by reflection at the boundary of the semiconductor and the first layer=$\lambda/2$;

A phase difference between Ei and Er1: A phase shift in the first layer+a phase inversion by reflection at the boundary of the first layer and the second layer=$\lambda/4 \times 2 + 0 = \lambda/2$;

A phase difference between Ei and Er2: A phase shift in the first and the second layers+a phase inversion by reflection at the boundary of the second layer and the third layer=$\lambda/4\times4+\lambda/2=3\lambda/2$.

The reflected field Er is the sum of the Er0, Er1, Er2, etc. and therefore a phase difference between the incident field Ei and the reflected field Er at the facet becomes odd multiples of $\lambda/2$, that is, the Ei and Er have the inversed phase. An intensity of the electric field in the resonator is expressed by $(Ei+Er)^2$ and then the intensity of the electric field at the facet is reduced by a large extent because two electric fields are cancelled each other according to the present invention.

A phase difference between each reflected field Er0, Er1 and Er2 of the present invention is calculated as follows.

A phase difference between Er0 and Er1: A phase shift in the first layer+a phase inversion by reflection at the boundary of the semiconductor and the first layer=$\lambda/4\times2+\lambda/2=\lambda$;

A phase difference between Er0 and Er2: A phase shift in the first and the second layers+a phase inversion by reflection at the boundary of the semiconductor and the first layer+a phase inversion by reflection at the boundary of the second layer and the third layer=$\lambda/4\times4+\lambda/2+\lambda/2=2\lambda$.

That is, because the phase differences between reflected fields Er0, Er1 and Er2 become always even multiples of $\lambda/2$, a high reflection factor can be obtained as the conventional structure.

In summary, according to the present invention the phases of the incident field Ei and the reflected field Er can be inversed while maintaining a high reflection factor, and thus the intensity of the electric field at the facet can be largely reduced. Fundamentally, the intensity of the electric field at the facet can be reduced to zero when the facet reflection factor of 100% is realized. Because the COD light output is proportional to the intensity of the electric field at the facet, the COD light output can be improved drastically. Therefore a high reliability and a high ESD resistance can be achieved even for a semiconductor laser for which high facet reflection factor is required.

Figure 7:
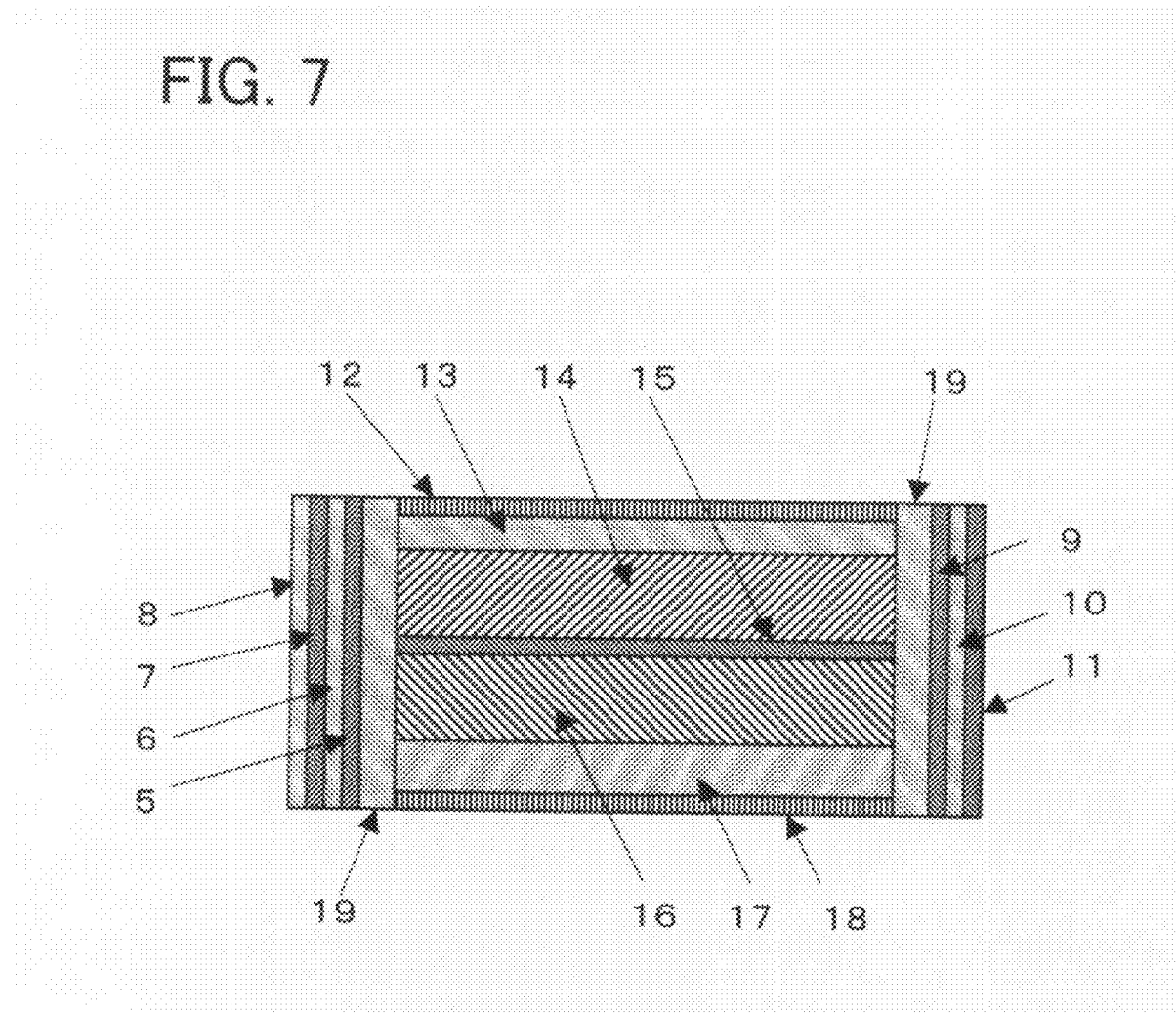
FIG. 7 is a sectional view of a semiconductor laser element according to example 2 of the present invention.
Figure 8:
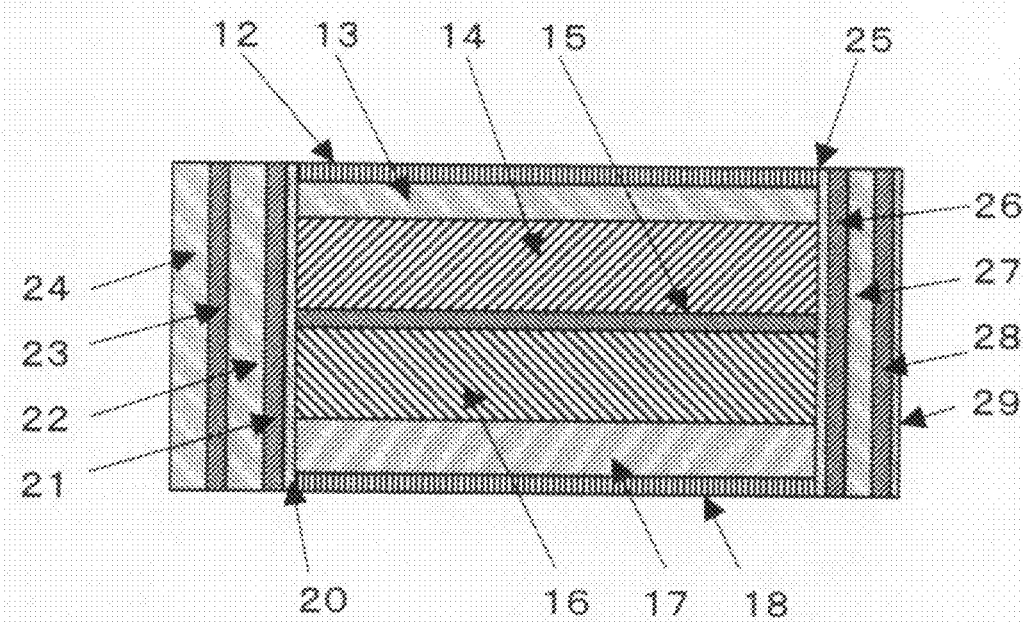
FIG. 8 is a sectional view of a semiconductor laser element according to example 3 of the present invention.
Figure 10:
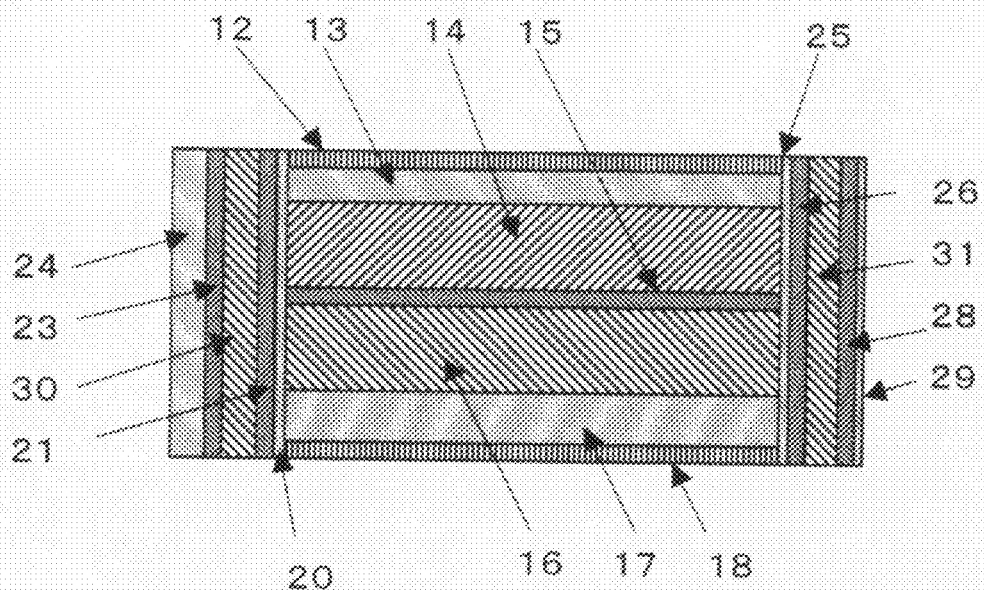
FIG. 10 is a sectional view of a semiconductor laser element according to example 4 of the present invention.

Basically a layer of a high refractive index is formed on a semiconductor as the first layer contacting (the end facet of) the semiconductor according to the present invention. However, it is sometimes desirable to use a dielectric film such as $Al_2O_3$ for the first layer as a passivation film to stabilize the semiconductor surface in accordance with a material of the semiconductor. In such a case when a layer of a high refractive index is not suitable for the first layer that is in contact with the semiconductor, other structures of examples can be selected as shown in FIGS. 7, 8 and 10. According to these examples a layer of low refractive index such as $Al_2O_3$ film or $SiO_2$ film is used as the first layer. A semiconductor laser shown in FIG. 8 is structured such that the first layer is a thin film having a thickness of a short optical path length and other layers are stacked in the alternating order of a layer of a high refractive index and a layer of a low refractive index. The optical path lengths of layers after a second layer are determined by the following expression:

$$\lambda/4 - r \cdot n1 \cdot d1,$$

where n1: refractive index of the first layer, d1: thickness of the first layer, and r: corrective factor (0.5-2.5).

The thickness of the first layer d1 is not limited to, but is preferably 1-60 nm.

The corrective factor r is used to correct the optical path length of the layer because the phase difference between the incident field Ei and the reflected field from each boundary becomes larger than odd multiples of $\lambda/2$ when the optical path length of each layer for the second and subsequent layers is set at $\lambda/4$. By adjusting the corrective factor r to a proper value, the phases of the incident field Ei and the reflected field Er can be set inversely even by the structure shown in FIG. 8, and the COD light output is improved drastically.

Next, examples of the present invention are described in detail with reference to the Figures.

Example 1

Figure 3:
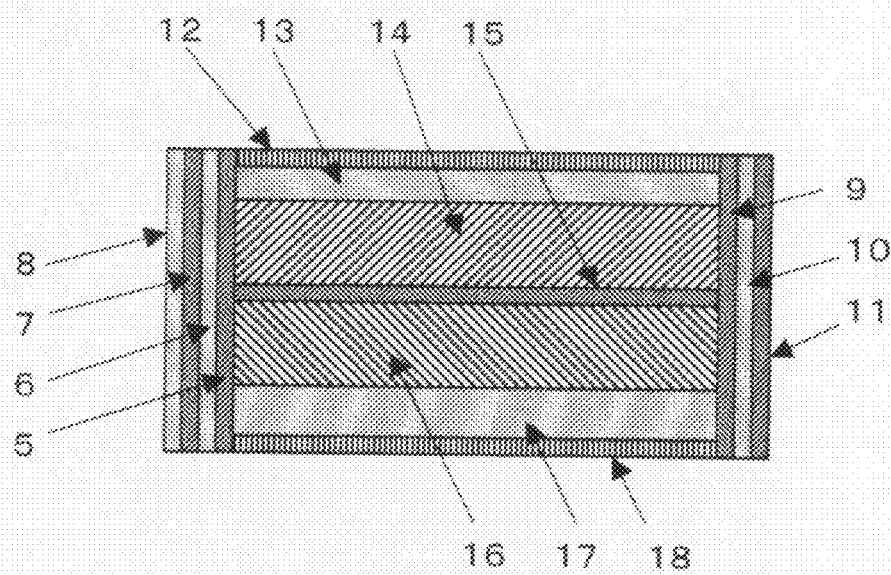
FIG. 3 is a sectional view of a semiconductor laser element according to example 1 of the present invention.

FIG. 3 illustrates a sectional view of a semiconductor laser element according to Example 1 of the present invention. The semiconductor laser resonator is made of a stack (laminate) including n-InP cladding layer 16, AlGaInAs multiple-quantum well activation layer 15, p-InP cladding layer 14 and p-InGaAs contact layer 13, stacked on an n-InP substrate 17, and further N-terminal 18 and P-terminal 12 so as to sandwich the stack. Coating films 5-11 are also formed at both facets of the resonator. High refractive index coating films 5, 7, 9 and 11 are made of amorphous Si (a-Si) and their thickness is 92.9 nm each whose optical path length is equal to $\lambda/4$ of an oscillation wavelength $\lambda=1.3$ µm. Low refractive index coating films 6, 8 and 10 are made of $Al_2O_3$ and their thickness is 197 nm each whose optical path length is equal to $\lambda/4$. Refractive indexes (N) of the amorphous Si (a-Si) and $Al_2O_3$ are 3.5 and 1.65, respectively. The front facet of the resonator is coated with four layers and the rear (opposite) facet is coated with three layers according to the structure of FIG. 3, and high reflection factors of 52.9% and 79.3% each are obtained. The coating films of both facets are structured as shown in FIG. 1, that is, the high refractive index coating layer(s) and the low refractive index coating layer(s) are stacked alternately from the first layer adjacent to the semiconductor laser resonator. Thus the intensity of the electric field at the facet is reduced and the COD light output is improved drastically.

Next, a manufacturing method of the semiconductor laser element according to Example 1 of the present invention is explained with reference to the drawings. After formation of the facet of the resonator by a cleavage method, the coating films 5-11 are formed successively by using a high frequency sputtering method, a plasma CVD method, a thermal CVD method, an ECR sputtering method and an ion-beam-assisted deposition method, and so on. To stack different materials successively, switching-over of targets for the sputtering method, or changes of flowing gases for the CVD method, are carried out alternatingly. A desired optical path length of the film can be controlled by monitoring reflection characteristics of laser light reflected from a sample film placed in the system. When a film formation rate is stable (constant), the desired optical path length can be controlled by the time of film formation. The structure of FIG. 3 according to Example 1 can be realized by this manufacturing method.

Figure 4:
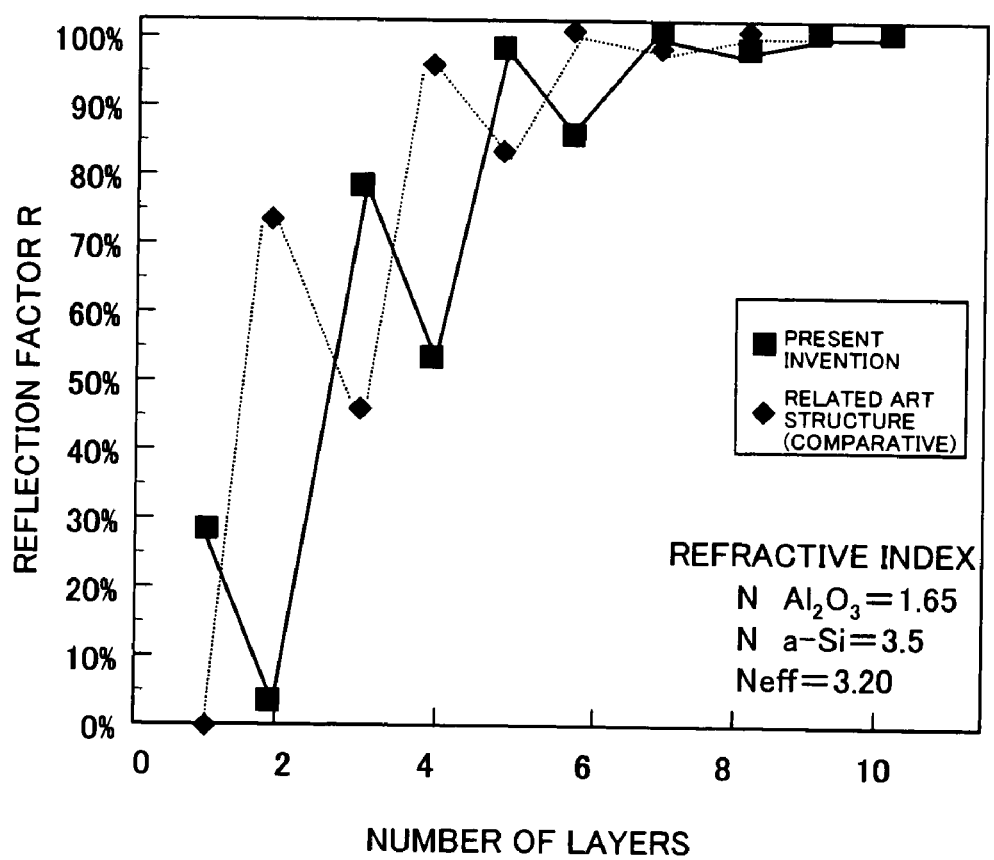
FIG. 4 is a graph showing a calculation result of the relation between numbers of layers and reflection factors of a semiconductor laser element according to the example 1 of the present invention.
Figure 5:
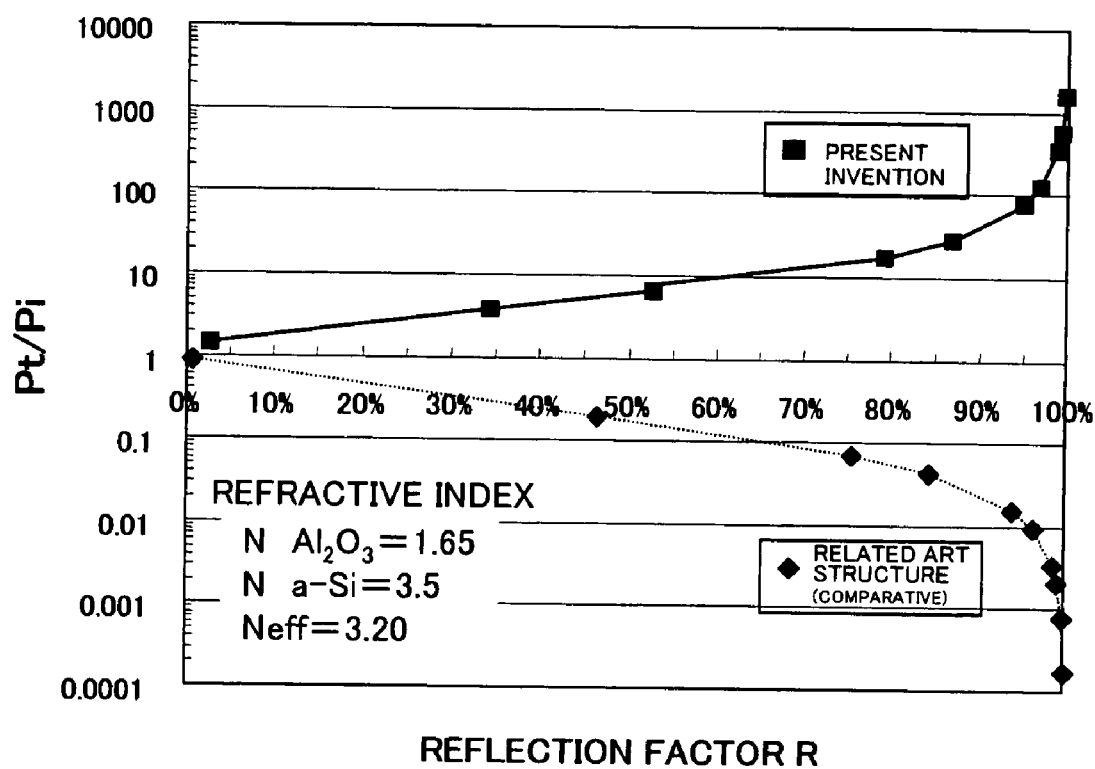
FIG. 5 is a graph showing a calculation result of the relation between reflection factors and Pt/Pi of a semiconductor laser element according to the example 1 of the present invention.

FIGS. 4 and 5 are graphs showing simulation results of the effects obtained by the structure of Example 1 of the present invention. FIG. 4 shows a relation between number of the layers of the multi-layered film by the abscissa and reflection factor by the ordinate. An oscillation wavelength 1.3 µm and an equivalent refractive index (Neff) 3.2 of the waveguide of the semiconductor are used for the calculation. Reflection factors calculated for the conventional structure are also shown in FIG. 4 for comparison. Desired reflection factors from 2.8% to 99.7% can be obtained by the structure of the present invention by changing the number of layers. The reflection factors at the front facet of four layers and rear facet of three layers of FIG. 3 are 52.9% and 79.3%, respectively.

The ordinate of FIG. 5 indicates normalized value, which is an intensity of the transmitting electric field $Pt=Et^2$ divided by an intensity of the electric field at the facet $Pi=(Ei+Er)^2$. Because the COD occurs when the intensity of the electric field in the semiconductor at the facet $Pi=(Ei+Er)$ exceeds a critical value, the larger the $Pt/Pi=Et^2/(Ei+Er)^2$ is, the higher the COD light output becomes. The abscissa of FIG. 5 is reflection factor R and a simulation by the conventional structure is also shown for comparison. As a result, the higher the reflection factor R is, the larger the Pt/Pi becomes and the value of Pt/Pi becomes 10-100 times larger than the conventional structure in a range of R 40%-90%.

For the structure shown in FIG. 3 the refractive index n1 of the first layer that is in contact with the semiconductor is preferably more than the equivalent refractive index neff of the waveguide of the semiconductor. However, even when neff is larger than n1, the Pt/Pi can be improved by stacking the appropriate number of layers in the order of high refractive index layer and low refractive index layer alternately from the first layer. That is, 'high refractive index layers' and 'low refractive index layer' for the present invention mean 'relatively high refractive index layer' and 'relatively low refractive index layer' compared to an adjacent layer and not mean absolute high or low values of refractive indexes.

Although the coating films of both facets are three and four layered in the structure shown in FIG. 3, any number of layers can be employed for the present invention in accordance with required reflection factors. And although the same materials for the layers 5, 7, 9 and 11 or layers 6, 8 and 10 were used for the example of FIG. 3, different materials can be used for each layer. It is enough to stack a high refractive index layer and a low refractive index layer alternately starting from the first layer which is adjacent to the semiconductor. In addition, the optical path length of each layer was $\lambda/4$ in FIG. 3; however, the lengths of odd multiples of $\lambda/4$ can be also employed to obtain the same COD improvement effect, as can be comprehended by the principle shown in FIG. 1.

Figure 6:
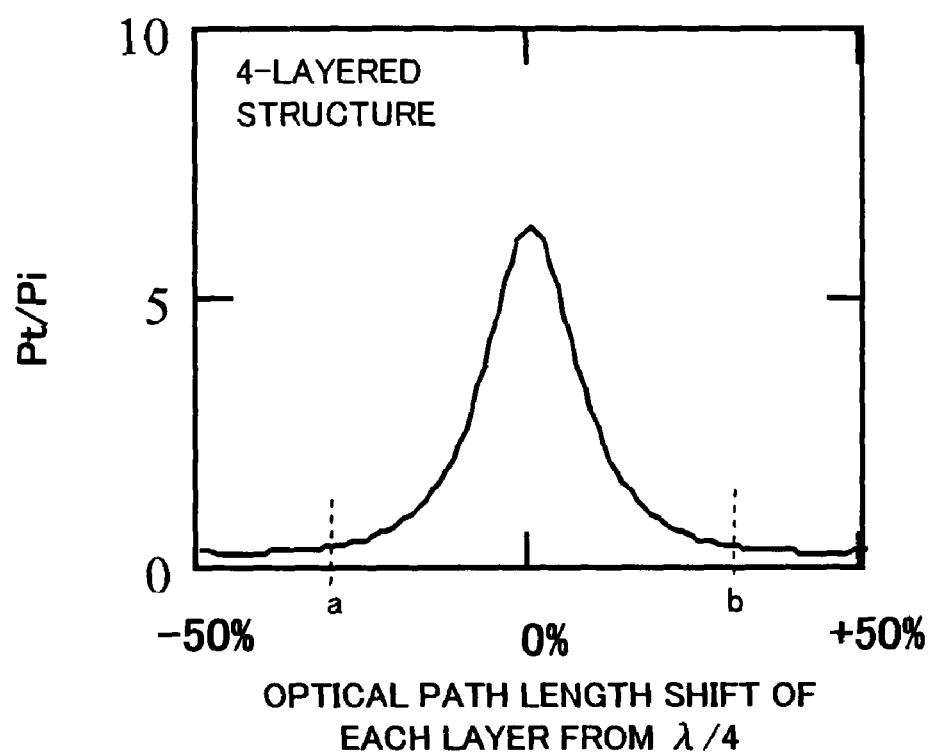
FIG. 6 is a graph showing a calculation result of Pt/Pi value when a length of an optical path of each layer of a semiconductor laser element according to the example 1 of the present invention is shifted from $\lambda/4$.

An optimum optical path length for each layer is $\lambda/4$ to obtain the COD improvement effect by the structure of the present invention. However, even when the optical path length differs slightly from $\lambda/4$, a sufficient COD improvement effect can be obtained compared to the conventional structure. FIG. 6 shows a calculation result of the Pt/Pi value when an optical path length of each layer is shifted from $\lambda/4$ in the case of a four-layered film front facet structure. A highest Pt/Pi=6.3 is obtained when the optical path length is $\lambda/4$; however, sufficiently higher Pt/Pi values than conventional one are obtained when the shift is within ±20% from $\lambda/4$. A range between a and b in FIG. 6 corresponds to a Pi/Pt range of 0.34 or above. The point a is at −31% shift which corresponds to $(1-0.45)\cdot\pi$ and the point b is at +31% shift which corresponds to $(1+0.45)\pi$.

Example 2

Although, the first layer adjacent to the semiconductor of Example 1 has a high refractive index as shown in FIG. 3, it is also possible to make the first layer as a low refractive index layer. FIG. 7 illustrates a cross sectional view of a semiconductor laser element according to Example 2 of the present invention, the first layer of which is a low refractive index layer. The semiconductor laser resonator is made of n-InP cladding layer 16, AlGaInAs multiple-quantum well activation layer 15, p-InP cladding layer 14, p-InGaAs contact layer 13, and P-terminal 12 are stacked on an n-InP substrate 17, in this order, provided that N-terminal 18 is formed on the other side of the substrate 17. And coating films 19 and 5-11 are formed at the both facets of the resonator. Both first coating films 19 adjacent to the semiconductor are made of $Al_2O_3$ and each thickness of the films is 394 nm, whose optical path length is $\lambda/2$ relative to an oscillation wavelength $\lambda=1.3$ µm. The structures of the coating films 5-11 are the same as those of FIG. 3.

A coating film of optical path length $\lambda/2$ is optically equivalent to the case of no film. Therefore, the structure of FIG. 7 is practically equivalent to the structure of FIG. 3 and the intensity of the electric field at the facet can be reduced drastically. The optical path length of the coating film 19 should not be necessarily $\lambda/2$ but an integral multiple of $\lambda/2$.

Example 3

FIG. 8 illustrates a cross sectional view of a semiconductor laser element according to Example 3 of the present invention, the first layer of which is a low refractive index layer. The semiconductor laser resonator is made of n-InP cladding layer 16, AlGaInAs multiple-quantum well activation layer 15, p-InP cladding layer 14, p-InGaAs contact layer 13, and P-terminal 12 stacked, in this order, on an n-InP substrate 17, and N-terminal 18 stacked on the other side of the substrate 17. And coating films 20-29 are formed at the both facets of the resonator. The films 22, 24, 27 and 29 are low refractive index layers and made of $Al_2O_3$ whereas the films 21, 23, 26 and 28 are high refractive index layers and made of amorphous Si (hereafter referred to as 'a-Si film'). The films 20 and 25 are thin films and made of $Al_2O_3$. The thicknesses of layers at the front facet (left side in FIG. 8) are; 20: $Al_2O_3$ film (30 nm), 21: a-Si film (74 mm), 22: $Al_2O_3$ film (157 nm), 23: a-Si film (74 nm), 24: $Al_2O_3$ film (150 nm), respectively. The thicknesses of layers of the rear (opposite) facet (right side in FIG. 8) are; 25: $Al_2O_3$ film (30 nm), 26: a-Si film (76 nm), 27: $Al_2O_3$ film (161 nm), 28: a-Si film (76 nm), 29: $Al_2O_3$ film (30 nm), respectively. According to the structure, the first layers (20, 25) are thin films and have short optical path lengths and the thickness of the k-th film (k=2, 3, 4) dk is determined by the next equation 1.

$$dk=\lambda/(4\cdot nk)-r\cdot n1\cdot d1/nk \qquad \text{(equation 1)}$$

where nk: refractive index of k-th layer, n1: refractive index of the first layer, d1: thickness of the first layer, and r: corrective factor (0.5-2.5). The thicknesses of the fifth layers are set so as to achieve a desired reflection factor. The high reflection factors of the front facet and the rear (opposite) facet of 54.3% and 72%, respectively are obtained by the structure shown in FIG. 8.

In the structure of FIG. 8 the intensity of the electric field at the facet is basically determined by multi-layered film of the second and subsequent layers because the first layer adjacent to the semiconductor is, although it is a low refractive index layer, a thin film and has a short optical path length. In addition, the optical path length of each layer of the second and subsequent layers is corrected from $\lambda/4$ by an amount equivalent to the first layer. Therefore, the intensity of the electric field at the facet is reduced drastically by the same effect as that is obtained by the structure shown in FIG. 3.

Figure 9:
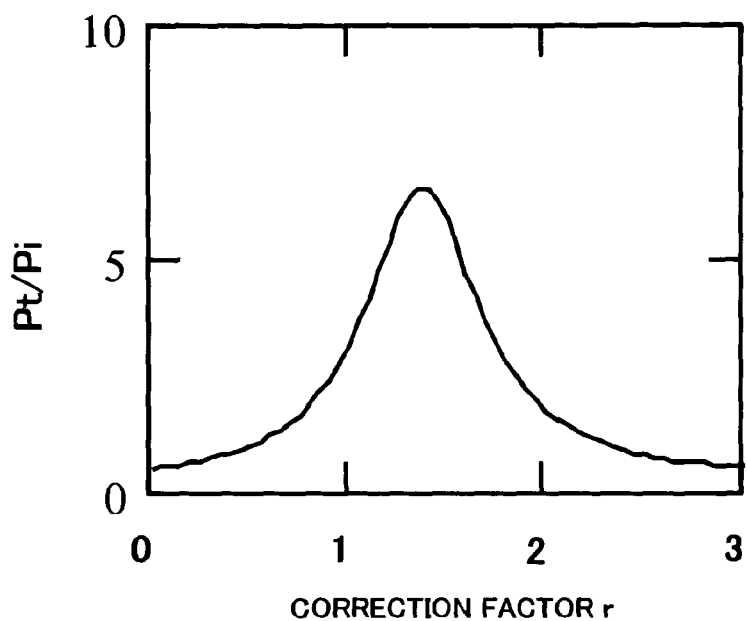
FIG. 9 is a graph showing a calculation result of the relation between a correction factor r and Pt/Pi of a semiconductor laser element according to the example 3 of the present invention.

FIG. 9 is a graph showing a calculation result of the relation between the correction term r and $Pt/Pi=Et^2/(Ei+Er)^2$ at the front facet having a five-layered structure. The abscissa of the graph is correction term (factor) r. There exists an optimum value of correction term r which derives a highest Pt/Pi, that is, at r of about 1.35 to 1.4, the highest Pt/Pi=6.5 is obtained. Also at the rear facet having the five-layered structure, when the r is at an optimum value 1.2 a highest Pt/Pi=12.0 is obtained. The correction term r is important when using the structure shown in FIG. 8. The calculation result suggests that the COD improvement effect cannot be obtained when the thicknesses of layers of the second and subsequent layers are set to exact λ/4.

FIG. 8 shows an example of which the multi-layered film has five layers; however, any number of layers can be employed for the present invention in accordance with a required reflection factor. Again although the same material for the layers 20, 22, 24, 25, 27 and 29 or layers 21, 23, 26 and 28 was used for the example of FIG. 8, different materials can be used for each layer. It is enough to determine necessary thicknesses for the layers obtained by the (equation 1) according to refractive indexes of the layers and stack a low refractive index layer and a high refractive index layer alternately starting from the first layer.

Example 4

FIG. 10 illustrates a cross sectional view of a semiconductor laser element according to Example 4 of the present invention, in which the third coating layers of FIG. 8 are substituted by a different material. Low refractive index coating layers 20, 24, 25 and 29 are made of $Al_2O_3$, and high refractive index coating layers 21, 23, 26 and 28 are made of amorphous Si, whereas coating layers (third layers) 30 and 31 are made of $SiO_2$. The thickness of each layer of the front facet is: 20: $Al_2O_3$ (30 nm), 21: a-Si (71 nm), 30: $SiO_2$ (171 nm), 23: a-Si (71 nm), 24: $Al_2O_3$ (150 nm), and the thickness of each layer of the rear facet is: 25: $Al_2O_3$ (30 nm), 26: a-Si (75 nm), 31: $SiO_2$ (180 nm), 28: a-Si (75 nm) and 29: $Al_2O_3$ (30 nm), respectively.

Higher reflection factors can be obtained by this structure compared to the structure of FIG. 8, because the structure of FIG. 10 has a larger difference of refractive indexes between materials of $SiO_2$ and a-Si. Reflection factors obtained by the structure in FIG. 10 are 55.6% at the front facet and 76.7% at the rear facet, respectively. A refractive index 1.45 of $SiO_2$ is assumed for the calculation. The thickness of each layer is also determined by the (equation 1) and high Pt/Pi value can be realized. A Pt/Pi of 6.8 at the five-layered front facet at an optimum r=1.55 and a Pt/Pi of 15.1 at the five-layered rear facet at an optimum r=1.3 are obtained, respectively.

Example 5

The AlGaInAs/InP system semiconductor laser having a range (band) of 1.3-1.6 μm is used to explain the examples above; however, a similar structure is also applicable for other semiconductor lasers such as AlGaAs/GaAs system having 0.7-0.8 μm range, AlGaAs/InGaAs/GaAs system having 0.9-1.0 μm range, AlGaInP/GaInP/GaAs system having 0.6 μm range and AlGaN/InGaN/GaN system having 0.4-0.5 μm range.

Figure 11:
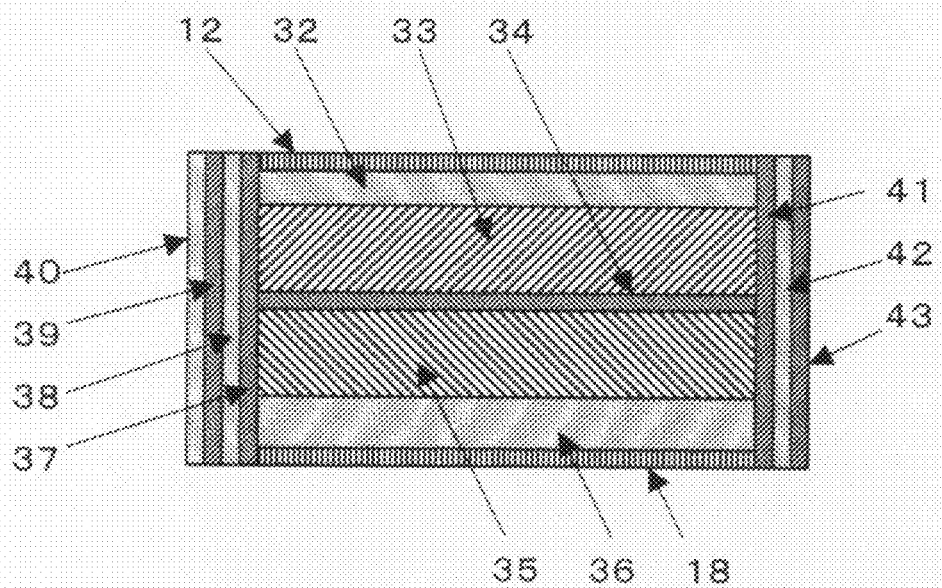
FIG. 11 is a sectional view of a semiconductor laser element according to example 5 of the present invention.
Figure 12:
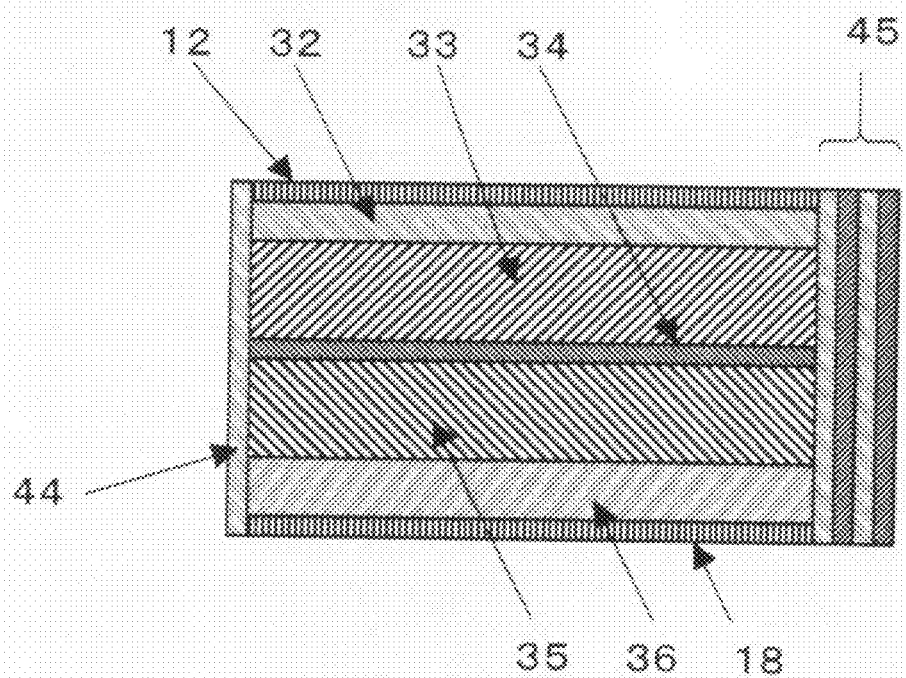
FIG. 12 is a sectional view of a comparative example of a conventional semiconductor laser element.

FIG. 11 illustrates a cross sectional view of a semiconductor laser element according to Example 5 of the present invention, in which the semiconductor laser in FIG. 3 is substituted by an AlGaInP/InGaP/GaAs system semiconductor laser having a 0.6 μm range of wavelength. The semiconductor laser resonator of FIG. 11 is formed of n-AlGaInP cladding layer 35, GaInP/AlGaInP multiple-quantum well activation layer 34, p-AlGaInP cladding layer 33, p-GaAs contact layer 32, and N-terminal 18 stacked on an n-GaAs substrate 36 in this order, and P-terminal 12 is stacked on the other side of the substrate 36. Coating films 37-43 are formed at both facets of the resonator. High refractive index coating films 37, 39, 41 and 43 are made of amorphous Si and the thickness is 45.7 nm each, whose optical path length is equal to λ/4 of an oscillation wavelength λ=0.64 μm. Low refractive index coating films 38, 40 and 42 are made of $Al_2O_3$, and their thickness is 97.0 nm each whose optical path length is equal to λ/4. Similarly, every structure in FIGS. 7, 8 and 10 besides FIG. 3 is applicable for every system of semiconductor lasers.

A protective layer having an optical path length λ/2 (or integral multiple of λ/2) can be formed for a last layer of the coating film according to the structure of FIGS. 3, 7, 8, 10 and 11. The effect of the layer having the optical path length λ/2 (or integral multiple of λ/2) is optically equivalent to the case of having no layer, and therefore, the same COD improvement effect can be obtained.

The intensity of the electric field at the facet is reduced by the structures of the present invention because the phases at the facets of the incident field and the reflected field are inversed. However, high intensity field exists at the position of anti-node of a stationary wave that is λ/(4·neff) (neff: equivalent refractive index of the semiconductor waveguide) apart from the facet. Therefore, when a non-emission level, which causes the COD, is formed reaching a depth of λ/(4·neff) by a structural damage (or defect), for example, at the time of coating film formation, a sufficient improvement effect of COD cannot be obtained. That is, it is important to decrease the damage at the film formation to realize the sufficient effect of the present invention. On the other aspect, because the distance of the anti-node of the stationary wave from the facet is proportional to the wavelength, a laser having a long wavelength is advantageous. From this point of view, the AlGaInAs/InP system semiconductor laser having a 1.3-1.6 μm wavelength range is less influenced by the damage in a shallow depth from the facet at the film formation and can obtain relatively stable improvement effect of the COD than other semiconductor lasers having a wavelength of 1.0 μm or less.

Although the materials of amorphous Si, $Al_2O_3$ and $SiO_2$ are used for the coating films in the above examples, other various kinds of materials such as $TiO_2$, SiNx, SiON, $ZrO_2$, $HfO_2$, AlN, $Ga_2O_3$, $Gd_2O_3$, $Ta_2O_5$, $Nb_2O_5$, SiC, BN, etc. can be utilized as a coating film. That is, by setting appropriate thicknesses of layers equivalent to the optical path lengths defined by the present invention according to refractive indexes of materials of the layers, every material can be used to realize the structure of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modification aforementioned.

What is claimed is:

1. A semiconductor laser element comprising a multi-layered reflection film formed on at least one facet of a resonator, wherein a phase difference between emitted laser light and reflected light from the multi-layered reflection film ranges from (1−0.45)·π to (1+0.45)·π at an emission facet, wherein an optical path length of each layer of second and subsequent layers except a last layer is determined by λ/4−r·n1·d1, where λ is an oscillation wavelength, r is a correction factor of 0.5 to 2.5, and n1 and d1 are a refractive index and a thickness of the first layer adjacent to said semiconductor, respectively, and wherein a low refractive index layer and a high refractive index layer are alternately stacked starting from the first layer adjacent to said semiconductor.

2. The semiconductor laser element as defined in claim 1, wherein an optical path length of each layer of said multi-layered reflection film is determined by $(2m-1)\cdot\lambda/4$, where $\lambda$ is the oscillation wavelength, and m is a positive integer, and
wherein a high refractive index layer and a low refractive index layer are alternately stacked starting from a first layer adjacent to said semiconductor.

3. The semiconductor laser element as defined in claim 1, wherein an optical path length of each layer of said multi-layered reflection film is within ±20% of a value determined by $(2m-1)\cdot\lambda/4$, where $\lambda$ is the oscillation wavelength, and m is a positive integer, and
wherein a high refractive index layer and a low refractive index layer are alternately stacked starting from a first layer adjacent to said semiconductor.

4. The semiconductor laser element as defined in claim 1, wherein an optical path length of each layer of second and subsequent layers of said multi-layered reflection film is determined by $(2m-1)\cdot\lambda/4$, where $\lambda$ is oscillation wavelength, and m is a positive integer,
wherein an optical path length of a first layer adjacent to said semiconductor is determined by $n\cdot\lambda/2$, where $\lambda$ is the oscillation wavelength, and n is a positive integer, and
wherein a low refractive index layer and a high refractive index layer are alternately stacked starting from the first layer adjacent to said semiconductor.

5. The semiconductor laser element as defined in claim 1, wherein an optical path length of each layer of second and subsequent layers of said multi-layered reflection film is within ±20% of a value determined by $(2m-1)\cdot\lambda/4$, where $\lambda$ is oscillation wavelength, and m is positive integer,
wherein an optical path length of the first layer adjacent to said semiconductor is within ±20% of a value determined by $n\cdot\lambda/2$, where $\lambda$ is oscillation wavelength, and n is positive integer, and
wherein a low refractive index layer and a high refractive index layer are alternately stacked starting from the first layer adjacent to said semiconductor.

6. The semiconductor laser element as defined in claim 1, wherein said thickness d1 of said first layer adjacent to said semiconductor is 1-60 nm.

7. The semiconductor laser element as defined in claim 1, wherein a protective layer whose optical path length is determined by $m\cdot\lambda/2$, where $\lambda$ is oscillation wavelength, and m is a positive integer, is formed as a last layer of said multi-layered reflection film.

8. The semiconductor laser element as defined in claim 1, wherein a material of said semiconductor is selected from a group consisting of AlGaInAs/InP system, AlGaAs/GaAs system, AlGaAs/InGaAs/GaAs system, AlGaInP/GaInP/GaAs system and AlGaN/InGaN/GaN system.

9. The semiconductor laser element as defined in claim 1, wherein said multi-layered reflection film comprises at least three or four layers.

10. A method for producing a semiconductor laser element comprising:
providing a resonator; and
forming a multi-layered reflection film on at least one facet of the resonator,
wherein a phase difference between emitted laser light and reflected light from the multi-layered reflection film is adjusted in a range from $(1-0.45)\cdot\pi$ to $(1+0.45)\cdot\pi$ at an emission facet, wherein an optical path length of each layer of second and subsequent layers except a last layer is determined by $80/4-r\cdot n1\cdot d1$, where $\lambda$ is an oscillation wavelength, r is a correction factor of 0.5 to 2.5, and n1 and d1 are a refractive index and a thickness of the first layer adjacent to said semiconductor, respectively, and
wherein a low refractive index layer and a high refractive index layer are alternately stacked starting from the first layer adjacent to said semiconductor.

11. The method for producing a semiconductor laser element as defined in claim 10, wherein an optical path length of each layer of said multi-layered reflection film is determined by $(2m-1)\cdot\lambda/4$, where $\lambda$ is the oscillation wavelength, and m is a positive integer, and
wherein a high refractive index layer and a low refractive index layer are alternately stacked starting from a first layer adjacent to said semiconductor.

12. The method for producing a semiconductor laser element as defined in claim 10, wherein an optical path length of each layer of said multi-layered reflection film is within ±20% of a value determined by $(2m-1)\cdot\lambda/4$, where $\lambda$ is the oscillation wavelength, and m is a positive integer, and
wherein a high refractive index layer and a low refractive index layer are alternately stacked starting from a first layer adjacent to said semiconductor.

13. The method for producing a semiconductor laser element as defined in claim 10, wherein an optical path length of each layer of second and subsequent layers of said multi-layered reflection film is determined by $(2m-1)\cdot\lambda/4$, where $\lambda$ is the oscillation wavelength, and m is a positive integer,
wherein an optical path length of a first layer adjacent to said semiconductor is determined by $n\cdot\lambda/2$, where $\lambda$ is the oscillation wavelength, and n is a positive integer; and
wherein a low refractive index layer and a high refractive index layer are alternately stacked starting from the first layer adjacent to said semiconductor.

14. The method for producing a semiconductor laser element as defined in claim 10, wherein an optical path length of each layer of second and subsequent layers of said multi-layered reflection film is within ±20% of a value determined by $(2m-1)\cdot\lambda/4$, where $\lambda$ is oscillation wavelength, and m is a positive integer,
wherein an optical path length of the first layer adjacent to said semiconductor is within ±20% of a value determined by $n\cdot\lambda/2$, where $\lambda$ is the oscillation wavelength, and n is a positive integer, and
wherein a low refractive index layer and a high refractive index layer are alternately stacked starting from the first layer adjacent to said semiconductor.

15. The method for producing a semiconductor laser element as defined in claim 10, wherein said thickness d1 of said first layer adjacent to said semiconductor is 1-60 nm.

16. The method for producing a semiconductor laser element as defined in claim 10, wherein a protective layer whose optical path length is determined by $m\cdot\lambda/2$, where $\lambda$ is oscillation wavelength, and m is a positive integer, is formed as a last layer of said multi-layered reflection film.

17. The method as defined in claim 10, wherein said multi-layered reflection film comprises at least three or four layers.

18. The semiconductor laser element as defined in claim 1, wherein the first layer comprises a thin film having a thickness of a short optical path length.

* * * * *